(12) United States Patent
Demeter

(10) Patent No.: US 6,439,992 B1
(45) Date of Patent: Aug. 27, 2002

(54) ELECTRONIC GAMING SYSTEM COOLING DEVICE

(76) Inventor: James Lee Demeter, 2447 Aumakua St., Pearl City, HI (US) 96782

( * ) Notice: Subject to any disclaimer, the term of this patent is extended or adjusted under 35 U.S.C. 154(b) by 0 days.

(21) Appl. No.: 09/747,899

(22) Filed: Dec. 26, 2000

(51) Int. Cl.$^7$ .................................................. H05K 5/00
(52) U.S. Cl. ........................ 454/184; 361/694; 55/385.4
(58) Field of Search ........................... 454/184; 361/694, 361/695; 55/385.4, 385.6, 467

(56) References Cited

U.S. PATENT DOCUMENTS

| | | | |
|---|---|---|---|
| 3,807,148 A | * | 4/1974 | Fike et al. ...................... 55/385 |
| 4,751,872 A | | 6/1988 | Lawson, Jr. |
| 5,107,398 A | | 4/1992 | Bailey |
| 5,345,779 A | * | 9/1994 | Feeney ........................ 62/259.2 |
| D371,192 S | | 6/1996 | Putro |
| 5,713,790 A | | 2/1998 | Lin |
| 5,721,670 A | | 2/1998 | Cochrane et al. |
| 5,888,134 A | | 3/1999 | Mcnair, Jr. |
| 6,213,866 B1 | * | 4/2001 | Impellizzeri ................. 454/184 |

* cited by examiner

Primary Examiner—Denise L. Esquivel
Assistant Examiner—Derek S. Boles

(57) ABSTRACT

A electronic gaming system cooling device for resisting the over heating of a video game system. The electronic gaming system cooling device includes a housing having a top wall, a bottom wall and a peripheral wall integrally coupled to and extending between the top and bottom walls. The housing has an inlet port therein and an outlet port therein. A fan member draws air into the housing through the inlet port. The fan member is positioned over the inlet port. The game system is positioned over the outlet port such that air is brought into the house and blown across the game system to cool the game system.

8 Claims, 2 Drawing Sheets

ELECTRONIC GAMING SYSTEM COOLING DEVICE

BACKGROUND OF THE INVENTION

1. Field of the Invention

The present invention relates to electronic device cooling systems and more particularly pertains to a new electronic gaming system cooling device for resisting the over heating of a video game system.

2. Description of the Prior Art

The use of electronic device cooling systems is known in the prior art. More specifically, electronic device cooling systems heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. No. 5,888,134; U.S. Pat. No. 5,721,670; U.S. Pat. No. 5,107,398; U.S. Pat. No. 5,713,790; U.S. Pat. No. 4,751,872; and U.S. Des. Pat. No. 371,192.

While these devices fulfill their respective, particular objectives and requirements, the aforementioned patents do not disclose a new electronic gaming system cooling device. The inventive device includes a housing having a top wall, a bottom wall and a peripheral wall integrally coupled to and extending between the top and bottom walls. The housing has an inlet port therein and an outlet port therein. A fan member draws air into the housing through the inlet port. The fan member is positioned over the inlet port. The game system is positioned over the outlet port such that air is brought into the house and blown across the game system to cool the game system.

In these respects, the electronic gaming system cooling device according to the present invention substantially departs from the conventional concepts and designs of the prior art, and in so doing provides an apparatus primarily developed for the purpose of resisting the over heating of a video game system.

SUMMARY OF THE INVENTION

In view of the foregoing disadvantages inherent in the known types of electronic device cooling systems now present in the prior art, the present invention provides a new electronic gaming system cooling device construction wherein the same can be utilized for resisting the over heating of a video game system.

The general purpose of the present invention, which will be described subsequently in greater detail, is to provide a new electronic gaming system cooling device apparatus and method which has many of the advantages of the electronic device cooling systems mentioned heretofore and many novel features that result in a new electronic gaming system cooling device which is not anticipated, rendered obvious, suggested, or even implied by any of the prior art electronic device cooling systems, either alone or in any combination thereof.

To attain this, the present invention generally comprises a housing having a top wall, a bottom wall and a peripheral wall integrally coupled to and extending between the top and bottom walls. The housing has an inlet port therein and an outlet port therein. A fan member draws air into the housing through the inlet port. The fan member is positioned over the inlet port. The game system is positioned over the outlet port such that air is brought into the house and blown across the game system to cool the game system.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new electronic gaming system cooling device apparatus and method which has many of the advantages of the electronic device cooling systems mentioned heretofore and many novel features that result in a new electronic gaming system cooling device which is not anticipated, rendered obvious, suggested, or even implied by any of the prior art electronic device cooling systems, either alone or in any combination thereof.

It is another object of the present invention to provide a new electronic gaming system cooling device which may be easily and efficiently manufactured and marketed.

It is a further object of the present invention to provide a new electronic gaming system cooling device which is of a durable and reliable construction.

An even further object of the present invention is to provide a new electronic gaming system cooling device which is susceptible of a low cost of manufacture with regard to both materials and labor, and which accordingly is then susceptible of low prices of sale to the consuming public, thereby making such electronic gaming system cooling device economically available to the buying public.

Still yet another object of the present invention is to provide a new electronic gaming system cooling device which provides in the apparatuses and methods of the prior art some of the advantages thereof, while simultaneously overcoming some of the disadvantages normally associated therewith.

Still another object of the present invention is to provide a new electronic gaming system cooling device for resisting the over heating of a video game system.

Yet another object of the present invention is to provide a new electronic gaming system cooling device which includes a housing having a top wall, a bottom wall and a peripheral wall integrally coupled to and extending between the top and bottom walls. The housing has an inlet port therein and an outlet port therein. A fan member draws air into the housing through the inlet port. The fan member is positioned over the inlet port. The game system is positioned over the outlet port such that air is brought into the house and blown across the game system to cool the game system.

Still yet another object of the present invention is to provide a new electronic gaming system cooling device that may be used with conventional gaming systems.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
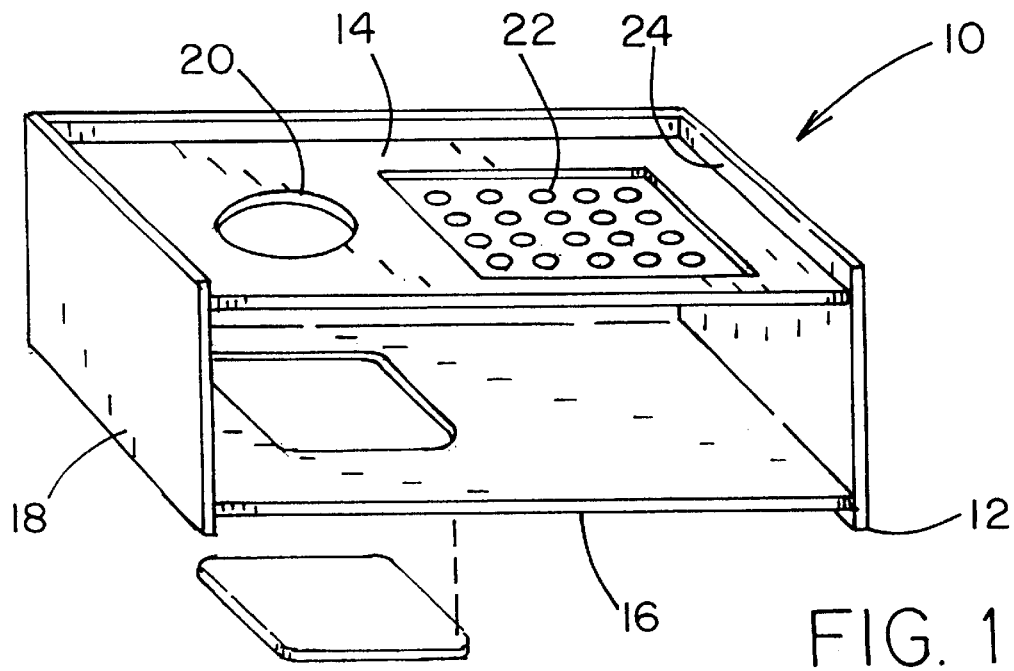
FIG. 1 is a schematic perspective view of the first embodiment of a new electronic gaming system cooling device according to the present invention and having a portion of the peripheral wall removed for seeing within the device.

With reference now to the drawings, and in particular to FIGS. 1 through 5 thereof, a new electronic gaming system cooling device embodying the principles and concepts of the present invention and generally designated by the reference numeral 10 will be described.

Figure 3:
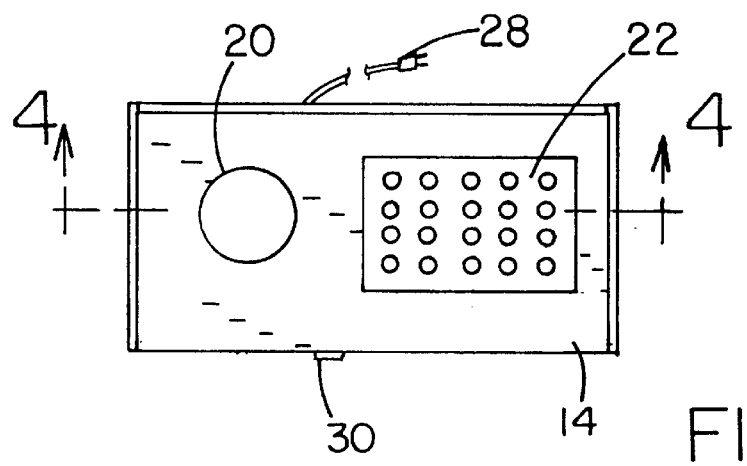
FIG. 3 is a schematic plan view of the first embodiment of the present invention.
Figure 4:
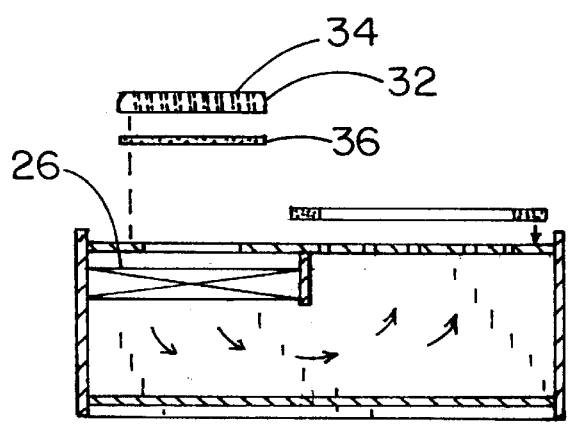
FIG. 4 is a schematic cross-sectional view taken along line 4—4 of the present invention.

As best illustrated in FIGS. 1, 3 and 4, the first embodiment of the electronic gaming system cooling device 10 generally comprises a housing 12. The housing 12 has a top wall 14, a bottom wall 16, and a peripheral wall 18 integrally coupled to and extending between the top 14 and bottom 16 walls. The housing 12 has an inlet port 20 therein and an outlet port 22 therein. The inlet port 20 is positioned in the top wall 14. The outlet port 22 is positioned in the top wall and comprises a plurality of openings. The outlet port 22 and the inlet port 20 are spaced from each other. The top wall 12 ideally has a perimeter lip 24 coupled thereto and extending upwardly therefrom.

A fan member 26 for drawing air into the housing 12 through the inlet port 20 is positioned in the housing 12 and secured to the top wall 14. The fan member 26 is positioned over the inlet port 20. Preferably, an electrical plug 28 is coupled to the fan member 26 for supplying power to the fan 26. Also preferably, there is an actuator 30 mounted on the housing 12 and electrically coupled to the fan member 26 for selectively turning the fan member off and on.

A cover 32 is positioned over the inlet port 20 and has a plurality of bores 34 extending therethrough. A conventional filter member 36 is positioned between the cover 32 and the inlet port 20 for filtering air brought into the housing 12.

A game system 38 is positioned on the top wall 14 and over the outlet port 22 such that air is brought into the house 12 and blown across the game system 38.

Figure 2:
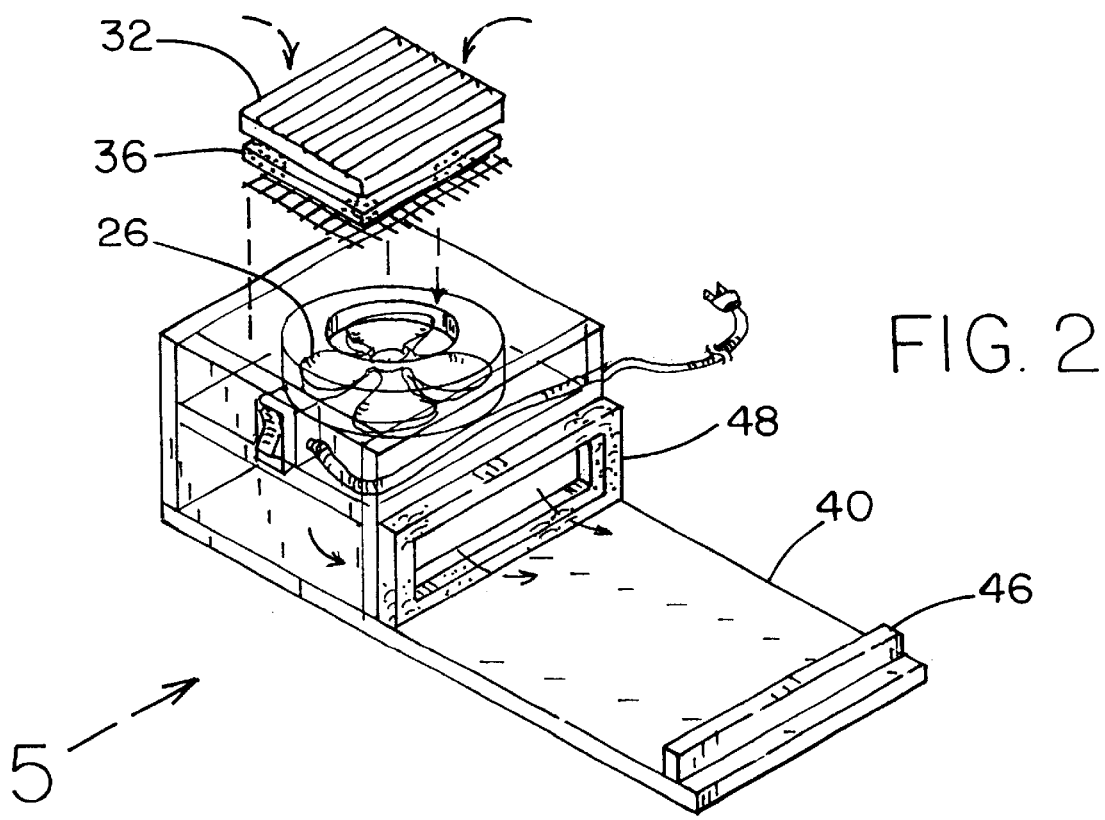
FIG. 2 is a schematic perspective view of the second embodiment of the present invention.
Figure 5:
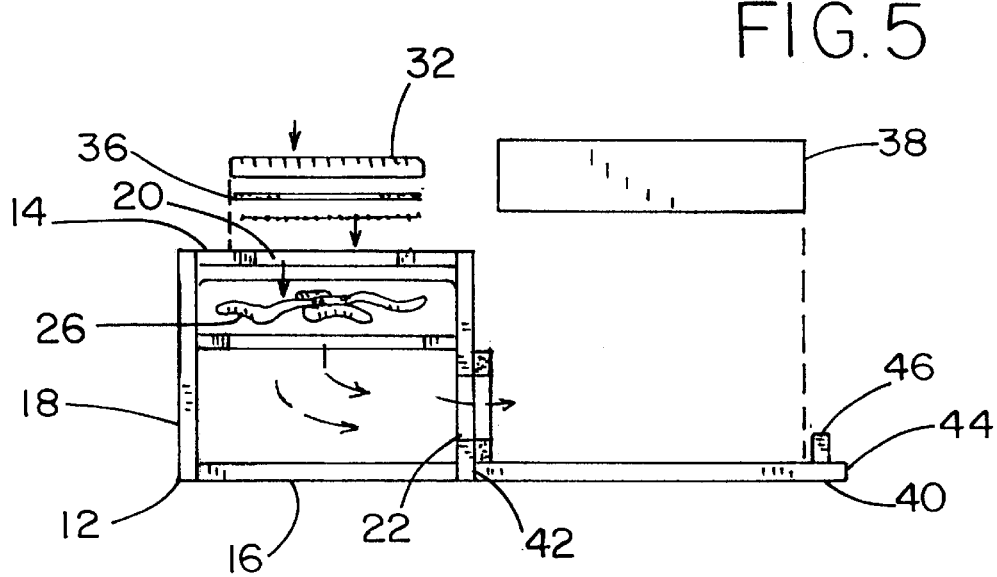
FIG. 5 is a schematic side view of the second embodiment of the present invention.

FIGS. 2 and 5 depict the second embodiment. The second embodiment has the outlet port 22 extending through the peripheral wall 18 instead of the top wall 14. A plate 40 has a first edge 42 securely attached to an outer surface of the peripheral wall 18 of the housing 12 such that the outlet port 22 is positioned between the plate 40 and the top wall 14 of the housing 12. The plate 40 has a second edge 44 positioned opposite of the first edge 42. A lip 46 is securely coupled to a top side of the plate 40 and extending upwardly therefrom. The lip 46 is positioned generally adjacent to and extending along the second edge 44 of the plate 40. The game system 38 is positionable on the plate 40 between the housing 12 and the lip 46 so that air is blown across the game system 38 to prevent overheating of the game system 38. Ideally, a foamed elastomeric material forms a seal around the outlet port.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A cooling device for cooling an electronic gaming system, said device comprising:

a housing, said housing having a top wall, a bottom wall, and a peripheral wall being integrally coupled to and extending between said top and bottom walls, said housing an inlet port therein and an outlet port therein, said inlet port being positioned in said top wall, said outlet port being positioned in said top wall and comprising a plurality of openings, said outlet port and said inlet port being spaced from each other;

a fan member for drawing air into said housing through said inlet port, said fan member being positioned over said inlet port;

wherein the game system is positioned over said outlet port such that air is brought into said house and blown across said game system.

2. The cooling device as in claim 1, further including a cover being positioned over said inlet port, said cover having a plurality of bores extending therethrough.

3. The cooling device as in claim 2, further including a filter member being positioned between said cover and said inlet port for filtering air brought into said housing.

4. The cooling device as in claim 1, further including a plate having a first edge securely attached to and extending away from an outer surface of said peripheral wall of said housing such that said outlet port is positioned between said plate and said top wall of said housing, said plate having a second edge positioned opposite of said first edge, a lip being securely coupled to a top side of said plate and extending upwardly therefrom, said lip being positioned generally adjacent to and extending along said second edge of said plate, wherein said game system is positionable on said plate.

5. The cooling device as in claim 4, further including a cover being positioned over said inlet port, said cover having a plurality of bores extending therethrough.

6. The cooling device as in claim 4, further including a filter member being positioned between said cover and said inlet port for filtering air brought into said housing.

7. A cooling device for cooling an electronic gaming system, said device comprising:

a housing having a top wall, a bottom wall, and a peripheral wall being integrally coupled to and extending between said top and bottom walls, said housing an inlet port therein and an outlet port therein, said inlet port being positioned in said top wall, said outlet port being positioned in said top wall and comprising a plurality of openings, said outlet port and said inlet port being spaced from each other;

a fan member for drawing air into said housing through said inlet port, said fan member being positioned in said housing and secured to said top wall, said fan member being positioned over said inlet port;

a cover being positioned over said inlet port, said cover having a plurality of bores extending therethrough;

a filter member being positioned between said cover and said inlet port for filtering air brought into said housing; and wherein the game system is positioned on said top wall and over said outlet port such that air is brought into said house and blown across said game system.

8. The cooling device as in claim 7, further including a perimeter lip being integrally coupled to and extending upwardly from said top wall of said housing.

\* \* \* \* \*